(12) United States Patent
Uzoh

(10) Patent No.: US 6,492,262 B2
(45) Date of Patent: Dec. 10, 2002

(54) PROCESS AND STRUCTURE FOR AN INTERLOCK AND HIGH PERFORMANCE MULTILEVEL STRUCTURES FOR CHIP INTERCONNECTS AND PACKAGING TECHNOLOGIES

(75) Inventor: Cyprian Emeka Uzoh, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/961,306

(22) Filed: Sep. 25, 2001

(65) Prior Publication Data

US 2002/0011673 A1 Jan. 31, 2002

Related U.S. Application Data

(62) Division of application No. 09/231,616, filed on Jan. 14, 1999, now Pat. No. 6,333,560.

(51) Int. Cl.⁷ .......................................... H01L 21/4763
(52) U.S. Cl. ........................ 438/637; 438/638; 438/687

(58) Field of Search ............................ 438/637, 638, 438/639, 640, 629, 653, 675, 678, 687; 257/672, 774, 775

(56) References Cited

U.S. PATENT DOCUMENTS 5,930,669 A * 7/1999 Uzoh ........................ 438/627
6,002,175 A * 12/1999 Maekawa ................... 257/760

FOREIGN PATENT DOCUMENTS

JP      4-9260306    * 10/1997
WO      WO 98/27585    6/1998

* cited by examiner

Primary Examiner—Steven Loke
Assistant Examiner—Hung Kim Vu
(74) Attorney, Agent, or Firm—Connolly Bove Lodge & Hutz; Joseph P. Abate

(57) ABSTRACT

Method and structures for making a highly reliable metal interlock structure with continuous via and line structures. The absence of barrier layers between vias and lines or absence of interlevel dielectric layer is used to enhance chip performance.

16 Claims, 11 Drawing Sheets

PROCESS AND STRUCTURE FOR AN INTERLOCK AND HIGH PERFORMANCE MULTILEVEL STRUCTURES FOR CHIP INTERCONNECTS AND PACKAGING TECHNOLOGIES

CROSS-REFERENCE TO RELATED APPLICATION

This application is a divisional of U.S. patent application Ser. No. 09/231,616 filed Jan. 14, 1999 U.S. Pat. No. 6,333,560.

TECHNICAL FIELD

The present invention relates to a structure and a process for plating vias and lines and is particularly concerned with significantly reducing, if not entirely eliminating, void formation in the plating in the vias and lines. The present invention finds particular applicability in filling undercut features in interconnect and packaging structures.

BACKGROUND OF INVENTION

AlCu and its related alloy are currently the predominately used conductors for forming interconnection from electronic devices such as integrated circuits. The amount of Cu in AlCu is typically in the range from about 0.3 to 4%.

Replacement of AlCu by Cu and Cu alloys as a chip interconnection material results in advantages of improved chip performance. Performances improved because the resistivity of Cu in certain copper alloys is less than the resistivity of AlCu. Besides performance, high chip yield count and higher circuit wiring density are also realized.

The advantages of copper metallization has been recognized by the entire semiconductor industry Copper metallization has been the subject of extensive research documented by two entire issues of the Materials Research Society (MRS) Bulletin when dedicated to academic research on this subject is MRS Bulletin, Vol. XVIII, No. 6 (June 1993) and the other dedicated to industrial research in MRS Bulletin, Vol. XIX, No. 8 (August 1994). A 1993 paper by Luther et al., Planar Copper-Polyamide Back End of the Line Interconnection for ULSI Devices, in Proc IEEE VLSI Multi-Level Interconnections Conference, Santa Clara, Calif., Jun. 8–9, 1993, page 15, describes the fabrication of copper chip interconnections with four levels of metallization.

Processes such as chemical vapor deposition (CVD) and electroless plating are popular methods for depositing copper. Both methods of deposition normally produce at best conformal deposits and inevitably lead to defects (voids or seams) in wiring especially when trenches have a cross section narrower at the top then at the bottom. Other problems of CVD have been described by Li et al., copper-based metallization in ULSI structures—Part II; Is Cu Ahead of its Time as an On-Chip Material?, MRSBULL., XIX, Vol. 15 (1994). In electroless plating, while offering the advantage of low cost, the evolution of hydrogen during metal deposition tends to lead to blistering and other defects that are viewed as weaknesses for industry-wide implementation.

Although, continuing work is being done to provide coating processes for fabricating low cost, highly reliable copper interconnect structures for wiring an integrated circuit chips with void-free seamless conductors of sub-micron dimensions, room for improvements still exists especially for filling vias that have an undercut feature.

The use of an undercut feature which may not be desirable; however, is desirable since it provides for a metal lock-in structure.

SUMMARY OF THE INVENTION

The present invention relates to a process for filling or plating vias and especially relates to significantly reducing, if not entirely eliminating, void formation in the filling in the vias. The present invention makes it possible to fabricate a low cost, highly reliable copper interconnect structure for wiring in integrated circuit chips with void-free seamless conductors of sub-micron dimension even in vias that include an undercut feature.

More particularly, the present invention includes providing a substrate having interconnect structures therein into which the conductor will be deposited to ultimately form lines or conductive vias. A electrically conductive seed layer or plating base layer is deposited in the vias. The electrically conductive interconnect in the vias is provided by electroplating from a bath containing an aliphatic amine alkoxylate surface active agent. The aliphatic amine alkoxylate is present in an amount sufficient to reduce void formation. The resulting structure can then be planarized or polished by chemical-mechanical polishing to thereby form individual lines and/or electrically conductive vias, electrically insulated from each other.

According to a further aspect of the present invention, an interconnect structure is provided on an electronic device by providing a substrate having interconnect structures therein, forming a conductive layer serving as a seed layer or plating base in the interconnect features, forming a patterned resist layer on the plating base, depositing the electrically conductor material by electroplating from a bath containing an aliphatic amine alkoxylate surface active agent in an amount sufficient to reduce void formation, and then removing the patterned photoresist. The bath also typically includes brightness and leveling agents.

BEST AND VARIOUS MODES FOR CARRYING OUT THE PRESENT INVENTION

In order to facilitate an understanding of the present invention, the embodiment discussed will be directed to a Damascene plating process in which plating is carried out over a substrate such as a semiconductor, flat panel or packaging substrate.

A schematic representation of the process of the present invention is illustrated in FIGS. 1–3 and 7–17.

Figure 1:
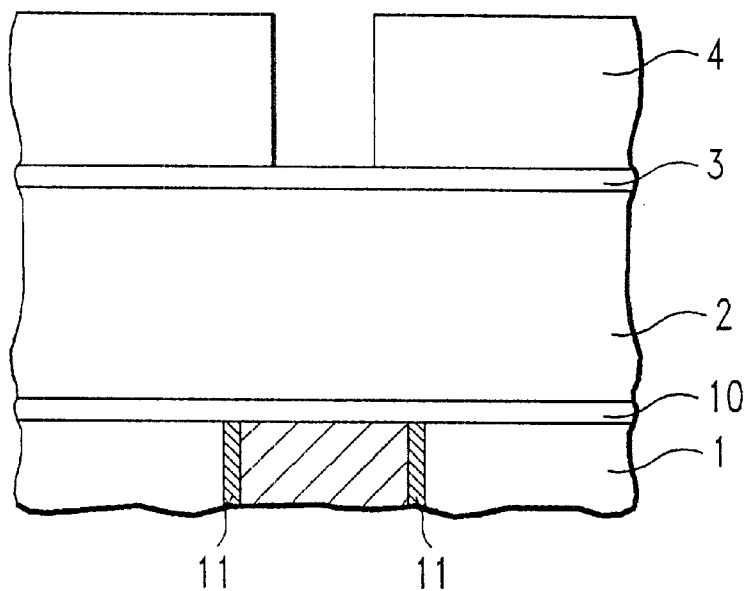
FIGS. 1–3 and 7–17 are cross-sectional views illustrate the structure at various stages of the process according to the present invention.
Figure 2:
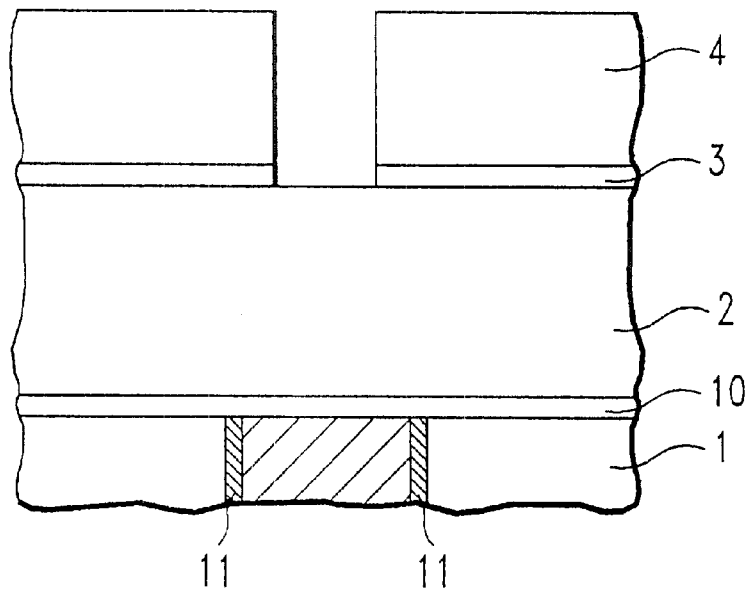

In particular, a layer of a first dielectric 2 is deposited over the semiconductor substrate or wafer 1. See FIG. 1. The dielectric layer 2 typically has a dielectric constant of less than 4. However, for certain applications, the dielectric constant of the dielectric layer 2 is greater than 10. As illustrated in FIG. 1, also included between the substrate 1 and dielectric layer 2 is an interlevel dielectric layer 10. Also, the substrate 1 includes lower level wiring 11. The interlevel dielectric layer is typically a silicon dioxide, silicon nitride, silicon oxynitride or alumina.

The preferred dielectric layer 2 is a polyimide. Polyimides suitable include unmodified polyimides, as well as modified polyimides, such as polyesterimides, polyimide-imide-esters, polyimide-imides, polysiloxaneimides, as well as other mixed polyimides. Such a well known in the prior art and need not be described herein in any great detail. The dielectric layer 2 is typically provided by coating with a polyimide precursor and then converting to the cured polyimide by heating. Commercially available, polyimide precursors (polyamic acid) or various polyimide precursors from DuPont and available under the trade designation Pyralin. These polyimide precursors come in many grades, including those available under the trade designations PI-2555, PI-2545, PI-2560, PI-5878, PIH-61454 and PI-2540. Some of these are pyromelletic dianhydride-oxydianiline (PMDA-ODA) polyimides precursors.

The dielectric layer 2 is typically about 2000 to about 20 microns thick and more typically about 3000 to about 30,000 angstroms thick.

According to preferred aspects of the present invention, a second layer 3 of a dielectric material is deposited on layer 2. This layer can be a silicon dioxide and/or silicon nitride and can be deposited by well-known techniques such as by plasma enhanced chemical vapor deposition. The preferred layer 3 is a silicon nitride. Typically the thickness of layer 3 is about 200 to about 5000 angstroms and more typically about 400 to about 1500 angstroms.

A photoresist 4 is then applied and then patterned by known photolithographic techniques to provide the desired pattern as shown in FIG. 1. The patterned photoresist then acts as a mask for removing exposed portions of the underlying dielectric layer 3, after which it can be removed (see FIG. 2) for instance by dissolving in a suitable solvent. The pattern in the dielectric layer 3 can be produced in the case of silicon nitride by reactive ion etching of the silicon nitride employing an etchant gas comprising a mixture of gaseous fluorocarbon and an oxygen containing gas. See FIG. 2. The amount of fluorocarbon is sufficient to provide the desired etching. The fluorocarbon can be represented by the formula $C_XF_Y$, where X is typically an integer of 1–4 and Y is typically an integer of 4–10.

The fluorocarbon, such as $CF_4$, plasma may be used to etch the nitride layer 3 to expose the polymer layer beneath. The polymer layer is then etched with oxygen plasma. A small amount of a fluorocarbon gas, such as $CF_4$, may be added to the oxygen.

The preferred amount of fluorocarbon gas, such as $CF_4$, is typically about 2 to about 10 percent of the total amount of gas. The flow rate of the oxygen containing gas is typically about 10 to about 2000 standard cubic centimeters per minute and that of the fluorocarbon gas is about 1 to about 200 standard cubic centimeters per minute. The preferred fluorocarbon gas is $CF_4$. The pressure in the chamber for the etching is usually about 2 milliliter to about 25 milliliter.

Figure 3:
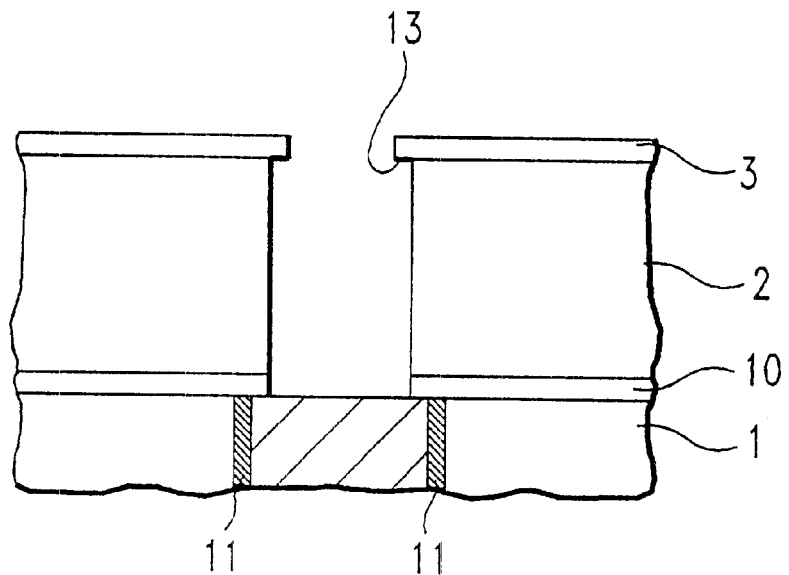

The layer 3 such as the silicon nitride layer is used as a RIE mask to etch the polymer layer 2 beneath. The polymer layer 2 is etched with an oxygen plasma that may contain a small amount of a fluorocarbon gas as discussed hereinabove. For most polymer films, when the etch rate of the dielectric layer 2 is higher than that of the masking layer 3, typically an undercut 13 may develop under the masking layer 3, as illustrated in FIG. 3. The undercut is essentially created by that region of the masking layer 3 protruding over the opening in the polymer insulator 2.

Figure 4:
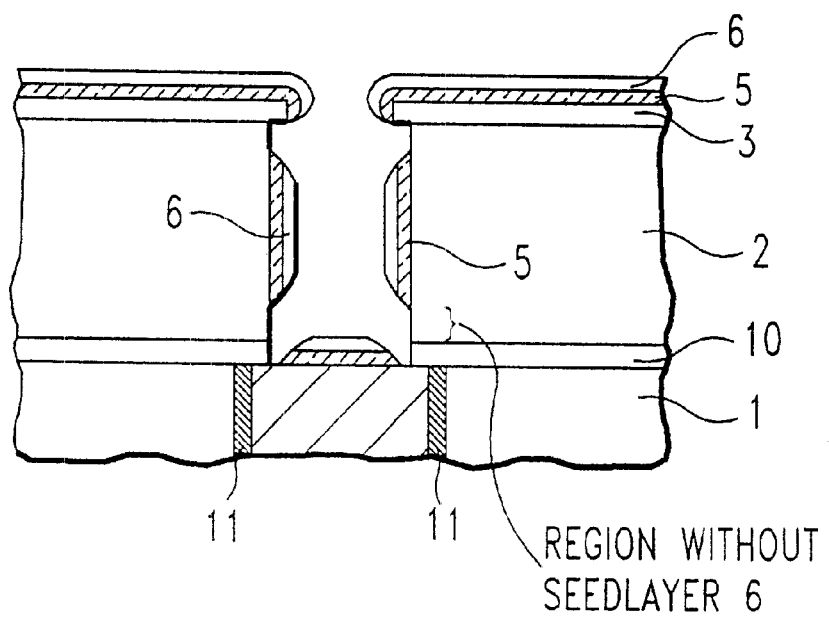
FIGS. 4, 5 and 6 are cross-sectional views illustrating structures according to the prior art.
Figure 5:
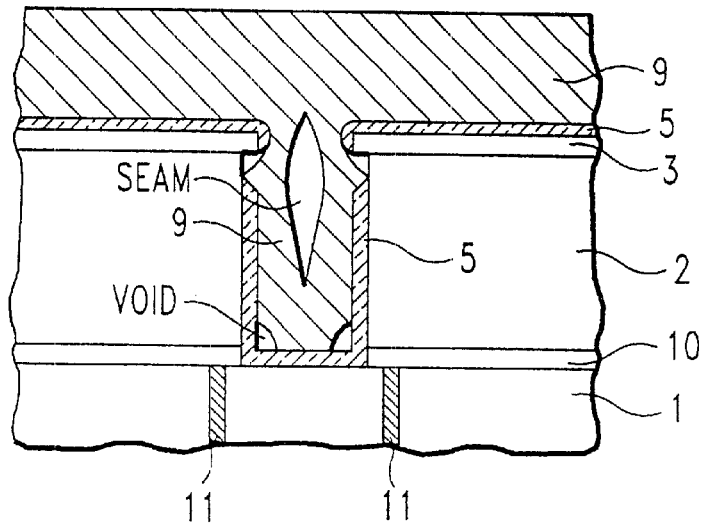
Figure 6:
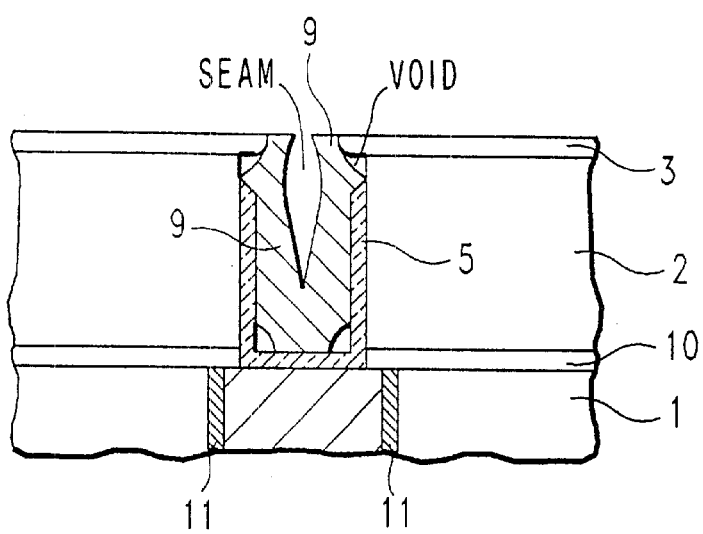

In prior art techniques, the barrier 5 and seedlayer 6 may be absent in the regions under the undercut at sidewalls adjacent to the bottom of the vias or trenches or interconnect structures. Filling of structures with defective barrier 5 and seedlayer 6 as illustrated in FIG. 4, either by electroplating, CVD, PVD or other methods produces vias and trenches with voids and seams as shown in FIGS. 5 and 6. Voids or seams in vias are most undesirable; apart from causing high via contact resistance, they produce premature interconnect failures and hence very poor interconnect electromigration lifetimes.

While undercuts are most undesirable because of its various detrimental effects in any device, especially when they contain seams and voids, on the other hand, the present invention incorporates and utilizes undercuts to create a physical lock in structures. Another aspect of the present invention relates to creating a continuous conduction metal structure over an undercut structure. In this structure (for example see FIGS. 11–18), there are no barrier layers between a via and a line or between the various metal levels. Thus, there is negligible contact resistance between lines and vias or between vias and the structures immediately beneath or above.

As discussed above, the present invention provides a method for producing a seamless and void-free undercut feature as a mechanical lock in a substrate.

According to certain aspects of the present invention, a continuous conduction metal superstructure can be created over the undercut lock-in structures.

The undercut structure as illustrated in FIG. 4 is achieved by the sequential etching of the RIE mask 3 and the polymer layer 2 beneath described hereinabove. Next, according to the present invention, a suitable barrier layer 5 such as tantalum nitride or tantalum or tungsten or alloy of tungsten is deposited over the structure by CVD, electroless plating or by PVD methods. See FIG. 7. The barrier layer 5 is deposited preferably by a sequential deposition and re-sputtering process. For example a thin layer of about 200 to about 1000 Å of Ta barrier material is sputtered over the undercut structure using a 1:2 collimator or ionized deposition methods. Next, the substrate is transferred to a sputtering chamber where about 40 to about 80% of the layer, typically about 150 to about 850 Å of the deposited Ta is sputtered off. A new layer of Ta about 20 to about 70% of the original thickness, typically about 100 to about 700 Å thick, is then deposited over the surface by a second Ta deposition step in the first chamber. In the fourth operation, the substrate is transferred to the second chamber where about 200 Å Ta is sputtered off from the surface.

Figure 7:
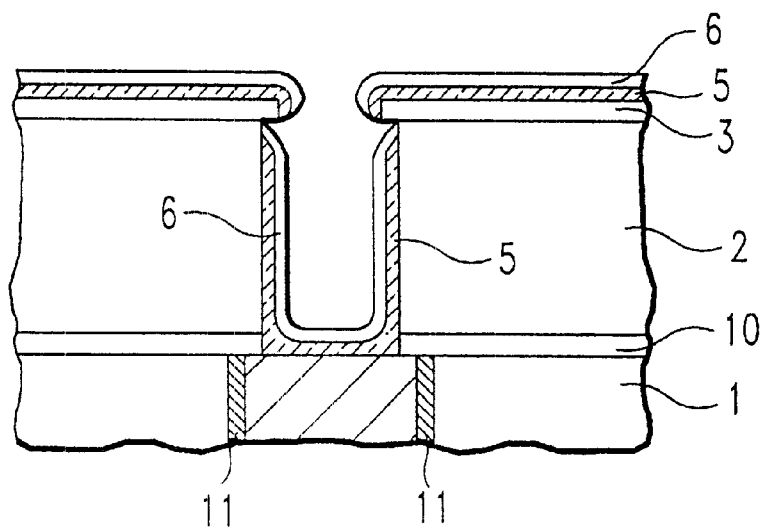
Figure 8:
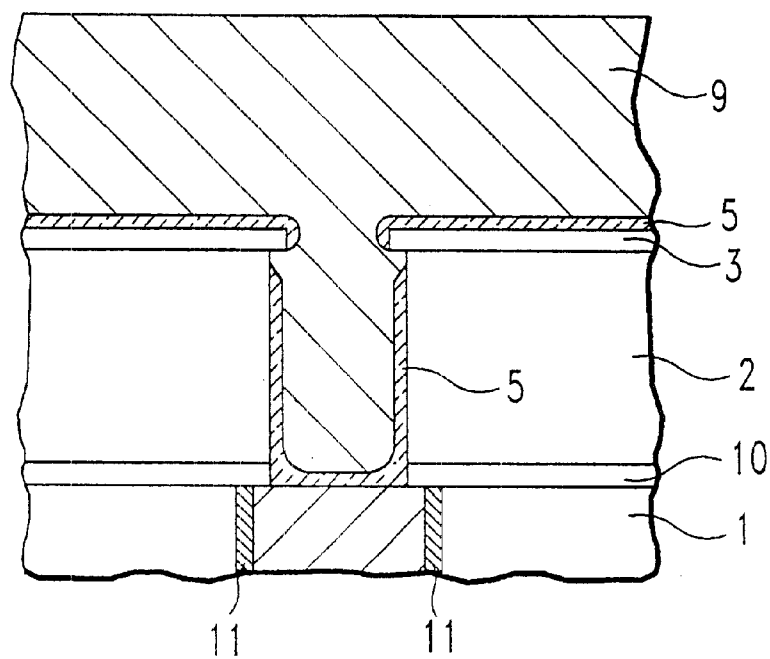

For the seedlayer 6 deposition, about 400 to about 3000 Å Cu is sputtered over the layer 5 using a 1:1 or 1:2 collimator in the copper deposition chamber. The substrate is then transferred to the second chamber where about 40% to 80% of the copper (e.g. about 350 to 2700 Å of Cu) is sputtered off the surface of the substrate. Finally, the substrate is returned to the copper deposition chamber where about 10% to about 50% of the original thickness, typically about 200 to 1500 Å of copper is sputtered on to the substrate. By judiciously combining metal sputtering and metal sputter etch processes, the profile of a continuous barrier and seedlayer structure 6 of FIG. 7 is produced.

The sputtering of the barrier layer and seedlayer to remove a portion thereof to the via assures that the opening is not significantly reduced in size. Moreover, the sputtering results in removing coating from the bottom of the via, some of which in turn redeposits on the sidewalls of the via rather than escaping from the via as a vapor. Moreover, the subsequent coating then helps to assure that the sidewalls are at least substantially fully coated.

This should be compared to FIG. 4 with defective barrier and seedlayer structure. An alternate process is to deposit the barrier and seedlayer films using electron cyclotron resonance or laser ablation PVD method. Here the deposition parameters are selected such that the deposition component of the plasma is slightly higher than the resputtering component, i.e. higher biases. The barrier 5 and copper seedlayer 6 may also be deposited by the combination of metal CVD and metal sputter etch process or by a combination of electroless deposition and metal sputter etch process.

The actual sputtering apparatus to be employed is well known as well as the sputtering technique for copper and need not be described herein in any detail. For instance, see Microelectronic Manufacturing and Testing, Selective Guide: Sputtering Equipment, November 1987, pages 1 and 19–22. In general, sputtering is conducted in a vacuum environment with noble gas ions such as argon being accelerated by an electric field. The resulting high-speed positive ions are then impacted on a suitable cathode target, which in the case of the present invention, can be copper. Due to the kinetic energy of the positive ions, atoms or molecules are blasted from the surface of the target material. These sputter particles are then deposited on the desired substrate. The copper seed layer is typically about 200 to about 4000 Angstroms thick and more typically about 400 to about 2000 Angstroms thick.

Pursuant to the present invention, the difficulty to fill the undercut features and significantly eliminating, if not completely eliminating, seams and voids is accomplished by electrodeposit employing an electroplating baths that can contain superleveling additives and special surfactants such as alkanol-ACN—an aliphatic amine alkoxylates base surfactant in an aqueous medium containing isobutylalcohol and isopropanol. See FIG. 8.

When an acid copper plating bath is used, in addition to the copper sulfate pentahydrate and sulfuric acid, other additives may be included such as chlorine ions, brighteners and leveling agents such as MD and $ML_o$, respectively, and other plating bath additives. MD and $ML_o$ are plating bath additives available from OMI-Enthone, Inc. and which are commonly used in the plating industry. The copper sulfate pentahydrate concentration within the solution may vary from about 20 to about 130 grams/liter. In the preferred embodiment, the concentration range lies within about 35 to about 110 grams/liter. The sulfuric acid content of the bath may range from about 100 to about 230 grams/liter and, in the preferred embodiment, the sulfuric acid content ranges from about 150 to about 210 grams/liter.

With respect to chlorine ions as additives, the plating bath concentration may vary from about 25 to about 180 parts per million, and lies within the range of about 45 to about 180 parts per million in the preferred embodiment. With respect to additive MD, the concentration may range from about 2 to about 18 millimeters/liter and, in the preferred embodiment, is within the range of about 4 to about 16 millimeters/liter. With respect to the concentration of additive $ML_o$ within the bath, the concentration range of the preferred embodiment will be between about 0.2 to about 3.5 millimeters/liter, but may range from about 0.3 to about 4.5 millimeters/liter.

On account of the tenuous seedlayer inside the undercut features, a small portion of surfactants, such as alkanol-ACN which suppresses seedlayer etching by acid baths may be added to the bath formulation. The concentration of the surfactant typically ranges from about 10 to about 700 ppm, and preferably in the range of about 25 to about 140 parts per million. Alkanol-ACN and other alkoxylate surfactants are available from DuPont.

After the brief dwell period within the plating solution, the plating process is initiated. during the plating process, the electroplating current density may range from 5 to 60 $mA/cm^2$. In the preferred embodiment, this current density may range from 3 to 40 $mA/cm^2$ and most desirably within the range of 5 to 30 $mA/cm^2$. The anode material used may consist of a CuP alloy, as typically used in copper deposition.

The plating is typically carried out in the temperature range of about 5 to about 60° C. and preferably about 10 to about 30° C.

Figure 9:
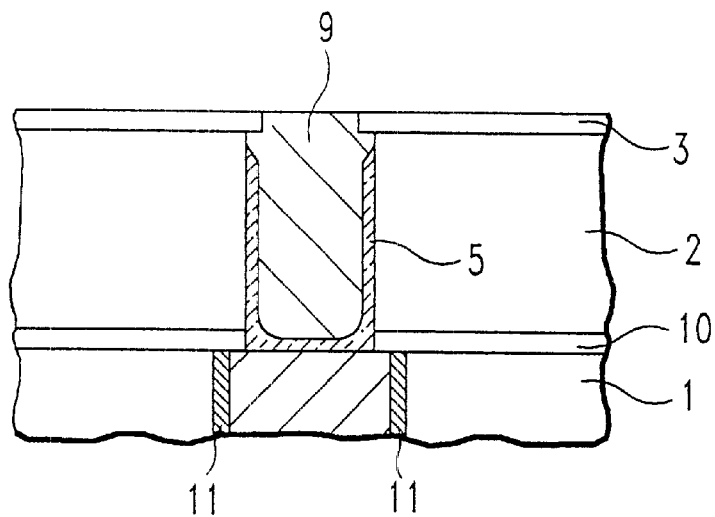

The plated undercut structure 9 (see FIG. 8) may be annealed in an inert ambient such as nitrogen to stabilize the plated film 9 before metal planarization as shown in FIG. 9. The annealing temperature may range from about 50 to about 450° C., for times varying from 3 minutes to 180 minutes. In the preferred embodiment, the annealing temperature may range from about 100 to about 390° C. for times ranging from about 5 minutes to about 150 minutes in nitrogen ambient or in vacuums.

Figure 10:
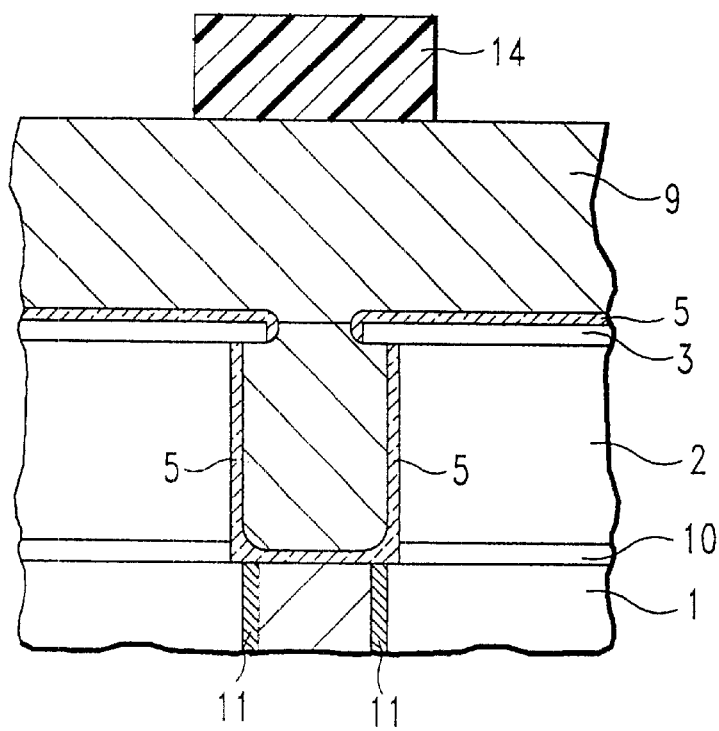
Figure 11:
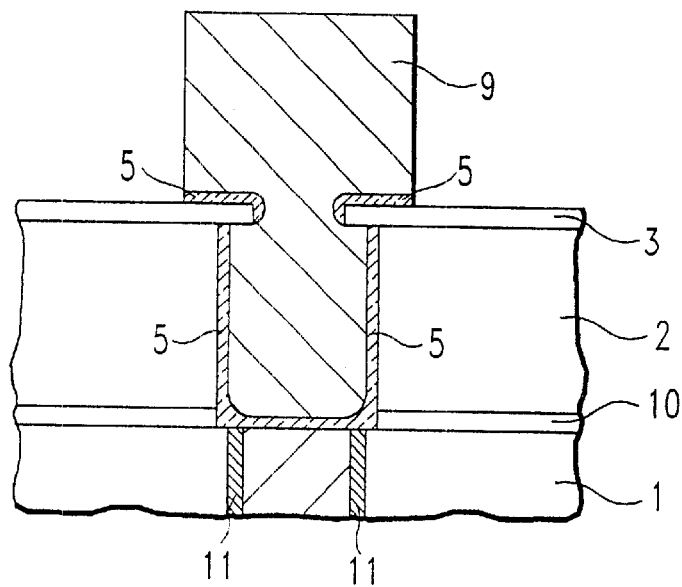

After the annealing step, to create a contiguous metal interlock structure over the via or metal line, instead of metal planarization, the metal overburden can be patterned with resist material 14 as illustrated in FIG. 10. The resist layer is used to protect the metal regions 9 over the undercut features. Next, the unprotected metal feature is removed by etching the copper film using a suitable copper etchant such as 1 to 5% acidified ammonium persulfate or preferably the plate copper is removed using electrolyte etching method with electrolytes such as phosphoric acid or glycerated sulfuric acid mixtures. After the unprotected overburden removal as illustrated in FIG. 11, showing a contiguous metal interlock structure, such that there is no barrier layer between the undercut feature and the metal over it.

Figure 12:
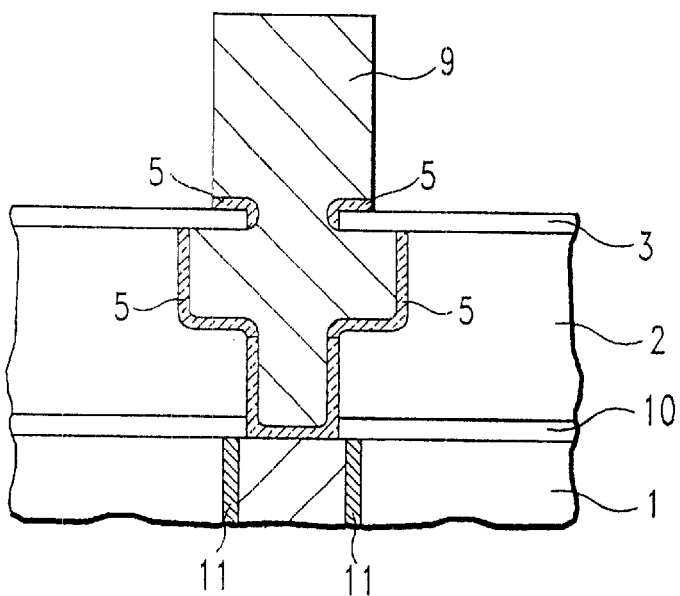
Figure 13A:
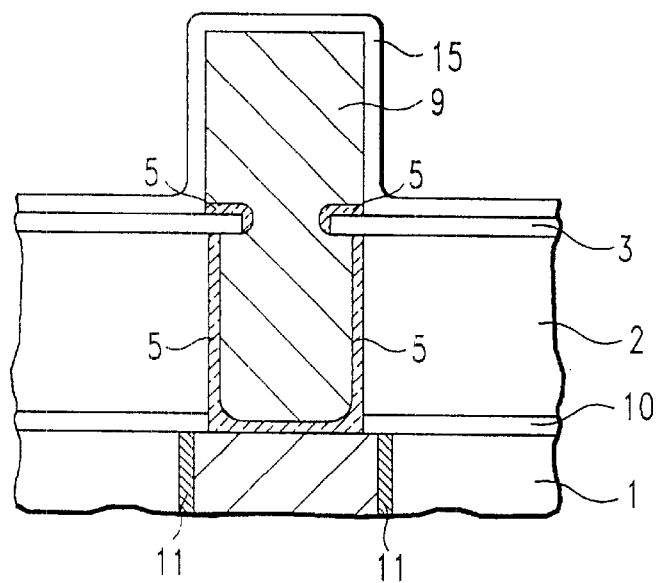
Figure 13B:
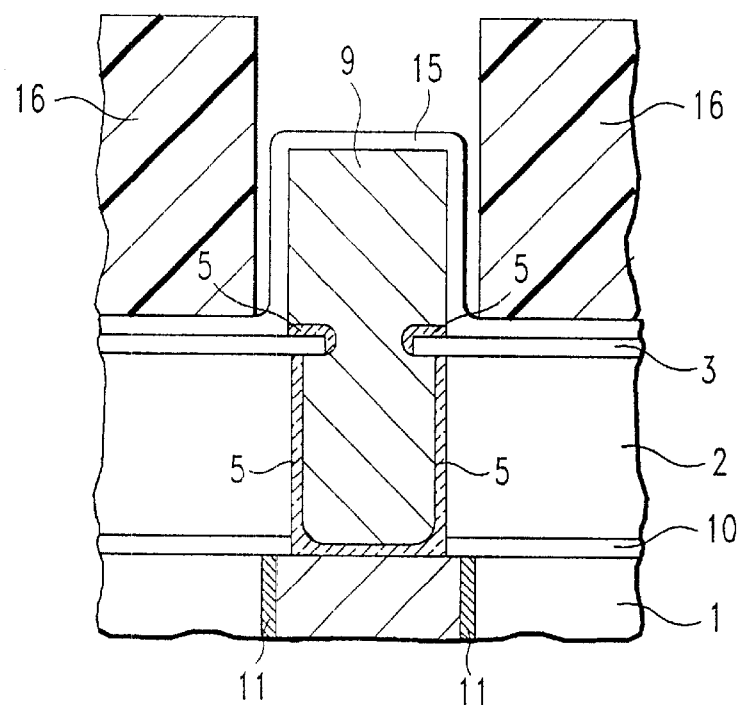
Figure 14:
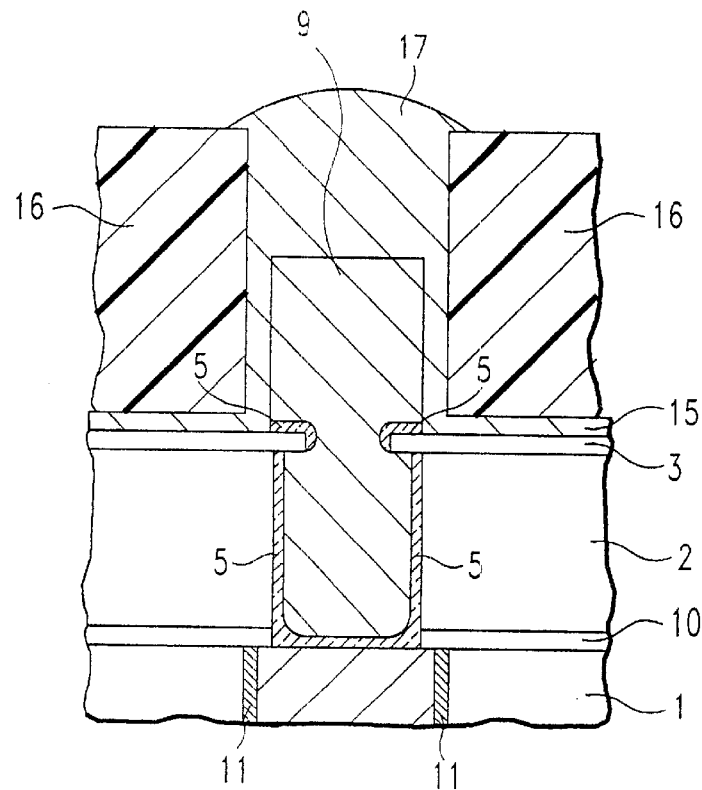
Figure 15A:
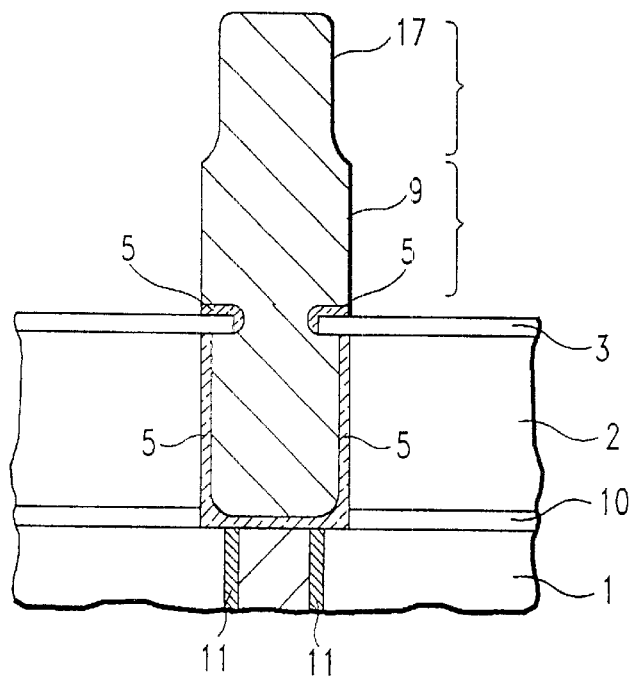
Figure 15B:
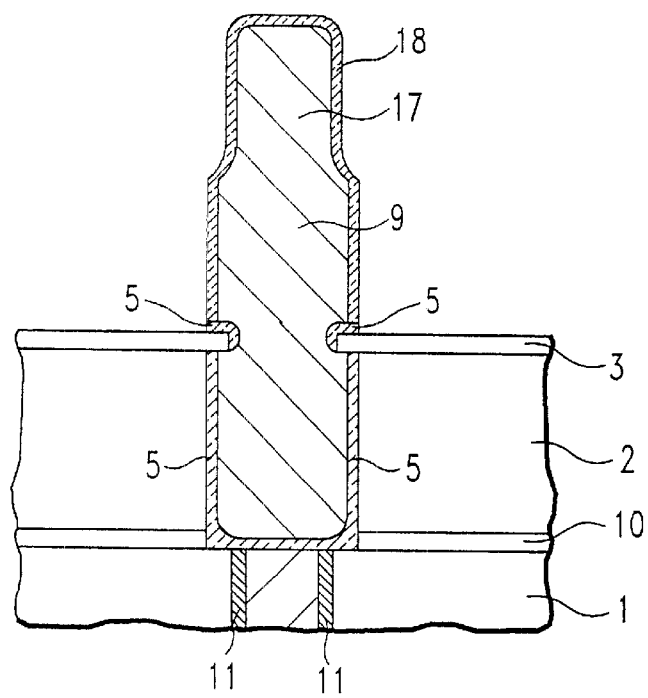
Figure 15C:
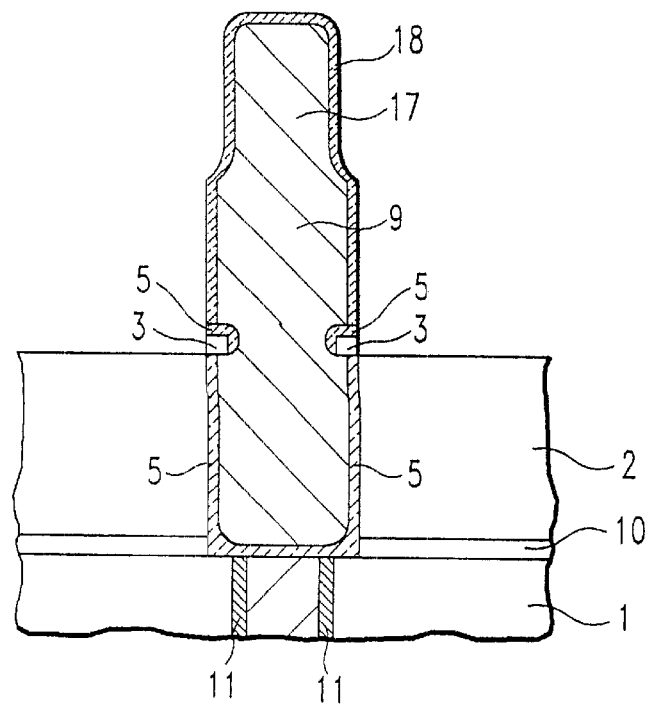
Figure 16:
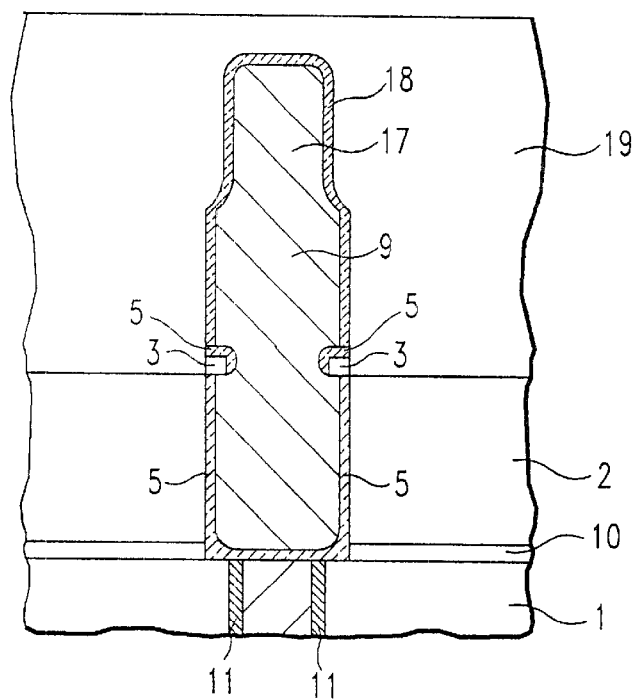
Figure 17:
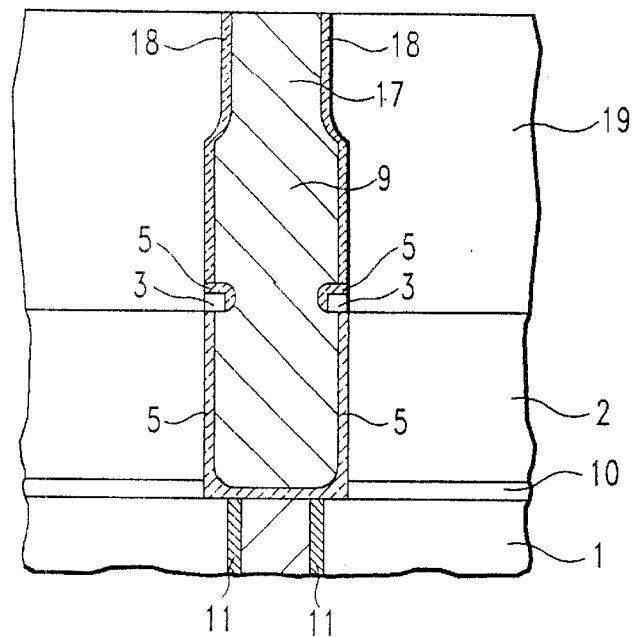
Figure 18A:
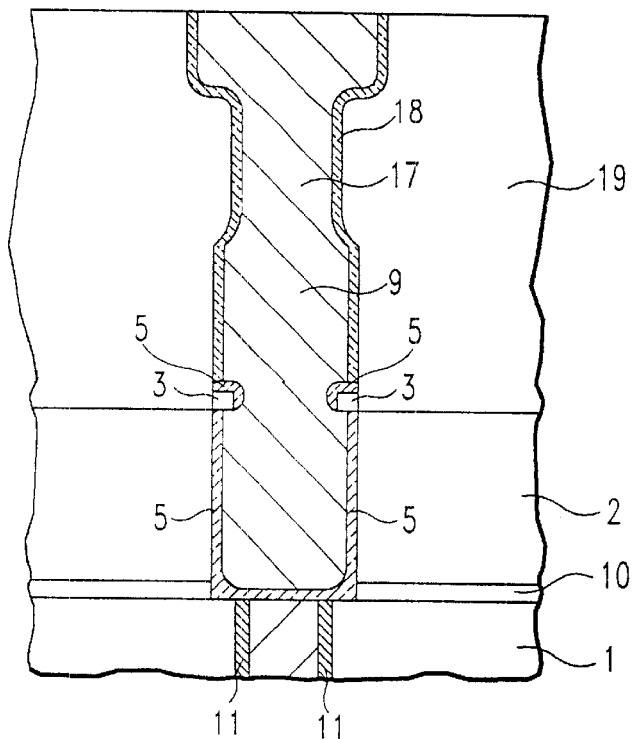
FIGS. 18a and 18b illustrate various alternative structures obtained by the process of the present invention.
Figure 18B:
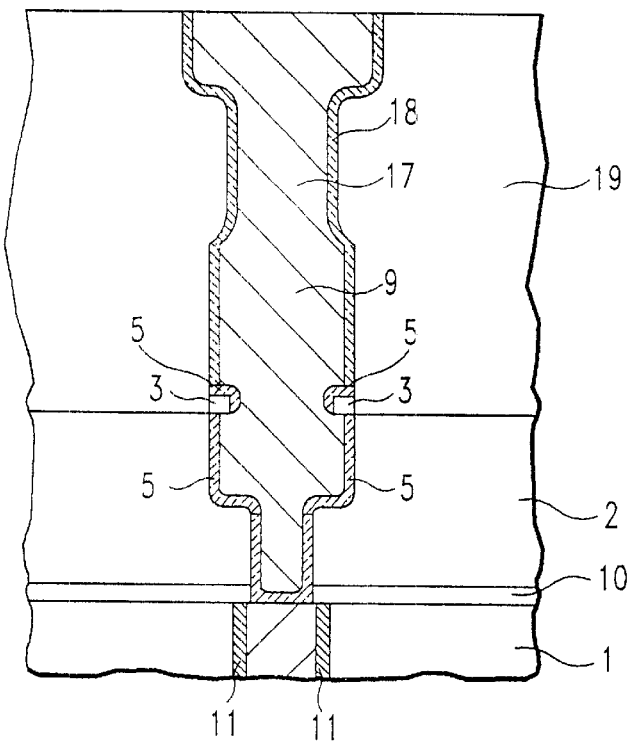

A similar embodiment can be prepared according to the present invention with a dual damascene interlock structure with a barrierless metal structure over the dual damascene structure is shown in FIG. 12. Next, starting with the structure in FIG. 11, a metal seedlayer 15 is deposited over the structure in FIG. 11, to form the structure in FIG. 13a. The metal seedlayer in the case of copper interconnect may be copper or copper alloy, and the thickness of the seedlayer 15 is typically about 200 Å to about 3000 Å, and preferably about 500 to about 2500 Å. The seedlayer 15 may be deposited by PVD, CVD, electroless or by laser ablation methods. Next, a resist material 16 is deposited over the metal seedlayer 15 and patterned to form the thru-mask metal plating structure shown in FIG. 13b. The patterned features are now filled with metal 17 by electroplating to form the structure in FIG. 14. The resist 16 is stripped, and the seedlayer 15 is removed by wet etching or preferably by electroetching method described hereinabove to form the structure shown in FIG. 15a. After the seedlayer 15 stripping, a barrier layer 18 may be selectively deposited over the plated metal structure using electroless metal deposition method. Examples of barrier films 18 are CoP, CoP(w) or NiP or other barrier layer metal could be deposited by electroless or immersion plating methods, as shown in FIG. 15b. Next, after the electroless selective metal capping, the interlevel dielectric layer or the original polymer RIE mask nitride layer 3 is removed by $CF_4$ RIE to form the structure in FIG. 15c. After the RIE mask removal 3, a new dielectric layer 19 is deposited over the capped features to form the structure shown in FIG. 16. This step is followed by dielectric planarization to form the structure in FIG. 17. Although the invention is described mostly in conjunction with single damascene structures shown in FIGS. 12–17, it is understood that the present invention may be formed with a dual damascene or other inlaid structures, such as those shown in FIGS. 18a and 18b, or with various combinations of single or dual damascene with single or dual level thru mask plating.

In addition to the strong mechanical interlock structure achieved, the present invention also advantageously results in the absence of barrier layers between the various metal level as found in the traditional damascene practice. The continuity in structure between via and lines and lines and vias (without barrier) practically eliminates contact resistances associated with the presence of barriers between via and lines. Also, the method of the present invention eliminated the traditional interlevel dielectric film or layers such as silicon nitride, known to reduce the performance of devices, on account of the higher dielectric constants. The continuity in structures between via and lines enhances the electromigration lifetimes of chip interconnects.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for plating vias which comprises providing a substrate having vias therein; depositing a metallic conductive seed layer in the vias and lines with undercuts; and filling the vias by electroplating copper by providing an acidic electrolytic copper bath containing an aliphatic alkoxylate surface active agent in an amount sufficient to suppress etching of the seed layer; providing an electrode; and passing an electric current through the plating bath in a direction to make the substrate a cathode.

2. The process of claim 1 wherein the seed layer is copper or copper alloy.

3. The process of claim 2 which comprises depositing the seed layer by sputtering or vapor deposition optionally in combination with metal etch or resputtering.

4. The process of claim 1 wherein the vias are formed by depositing a first insulating layer on the substrate and depositing a second insulating layer on the first insulating layer and etching the first and second insulating layers to define the vias.

5. The process of claim 4 wherein the etching defines vias that include an overhang of the second insulating layer over the first insulating layer.

6. The process of claim 5 wherein the first insulating layer is polyimide.

7. The process of claim 5 wherein the first insulating layer has a dielectric constant of less than 4.

8. The process of claim 5 wherein the first insulating layer has a dielectric constant greater than 10.

9. The process of claim 8 wherein the second insulating layer is a silicon nitride, silicon dioxide, silicon oxynitride or alumina.

10. The process of claim 9 wherein the etching comprises reactive ion etching of the second insulating layer employing a gaseous mixture of a fluorocarbon and oxygen gas and oxygen plasma etching of the polyimide to create the overhang.

11. The process of claim 5 which further comprises depositing and patterning a resist layer after the electroplating to protect metal regions over undercut features, and removing unprotected metal thereby forming a metal interlock structure.

12. The process of claim 1 which further comprises planarizing after the electroplating.

13. The process of claim 1 which comprises forming a patterned resist layer on the seed layer prior to the electroplating.

14. The process of claim 13 which comprises removing the patterned resist after the electroplating.

15. The process of claim 1 which comprises depositing the seedlayer followed by removing a portion of the seed layer by etching and then depositing additional seedlayer.

16. The process of claim 15 which further comprises providing a barrier layer in the vias prior to the seedlayer.

* * * * *